United States Patent [19]

Barraclough et al.

[11] Patent Number: 5,429,510

[45] Date of Patent: Jul. 4, 1995

[54] HIGH-DENSITY INTERCONNECT TECHNIQUE

[75] Inventors: William D. Barraclough, Danville; Mikhail A. Alperin, San Francisco; Jeffrey A. Brehm, So. San Francisco; John D. Hoang, Milpitas; Patrick M. Shepherd, San Jose; James F. Tomic, San Francisco, all of Calif.

[73] Assignee: Aehr Test Systems, Inc., Mountain View, Calif.

[21] Appl. No.: 161,282

[22] Filed: Dec. 1, 1993

[51] Int. Cl.⁶ ............................................. H01R 9/09
[52] U.S. Cl. ............................................. 439/59; 439/79
[58] Field of Search ..................... 439/59, 60, 65, 66, 439/79, 80, 284, 924

[56] References Cited

U.S. PATENT DOCUMENTS

| | | | |
|---|---|---|---|
| 3,771,100 | 11/1973 | Reed | 439/59 X |
| 4,623,207 | 11/1986 | Sasaki et al. | 439/66 X |
| 4,738,625 | 4/1988 | Burton et al. | 439/59 |
| 5,305,182 | 4/1994 | Chen | 439/65 X |

Primary Examiner—Z. R. Bilinsky
Attorney, Agent, or Firm—Cooley Godward Castro Huddleson & Tatum

[57] ABSTRACT

A high density interconnect system (30) employs contact fingers (32) on both surfaces (34) and (36) of burn-in PCB (38), feed-through PCB (40) and driver PCB (42). Each of the PCBs (38), (40) and (42) has a card-edge connector (44), (46) and (48). The feed-through PCB (40) has a second card-edge connector (40) and a second set of contact fingers (32), since it mates with both the burn-in PCB (38) and the driver PCB (42). The contact fingers (32) and the card-edge connectors (44), (46), (48) and (50) of each PCB (38), (40) and (42) mate inversely with each other on adjacent PCBs, i.e., the card-edge connector (44) of the burn-in PCB (38) mates with the contact fingers (32) of the feed-through PCB (40), and the card-edge connector (46) of the feed-through PCB (40) mates with the contact fingers (32) of the burn-in PCB (38), for example. The same relationship exists between the card-edge connector (50) of the feed-through PCB (40), the card-edge connector (48) of the driver PCB (42) and the contact fingers (32) of the feed-through PCB(40) and the driver PCB (42).

12 Claims, 4 Drawing Sheets

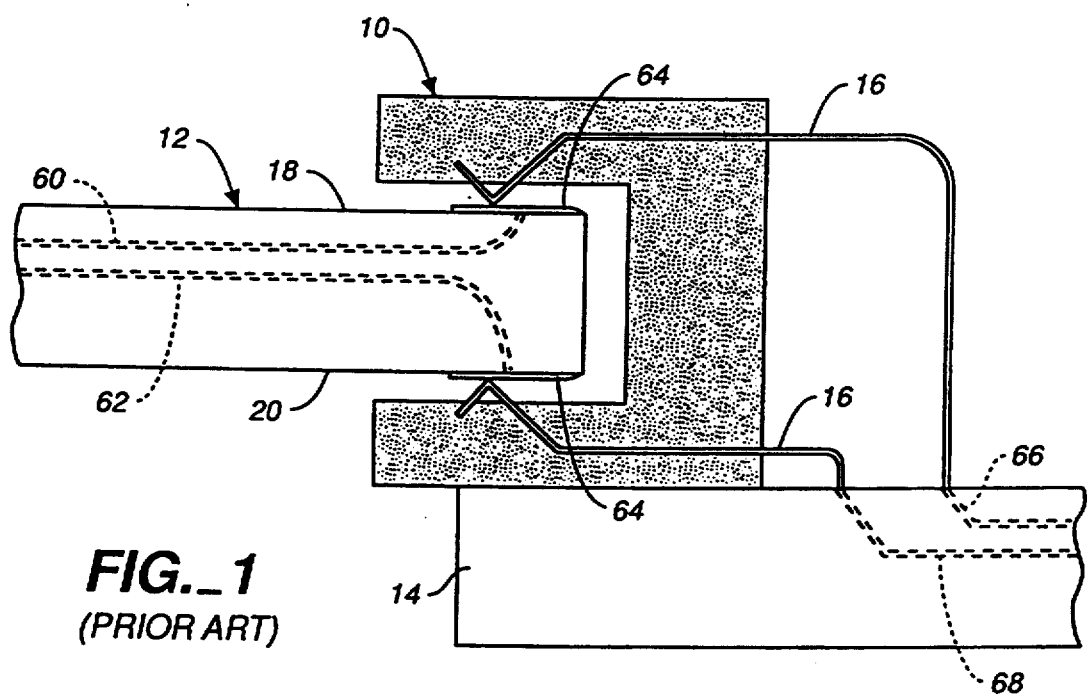
FIG._1
(PRIOR ART)
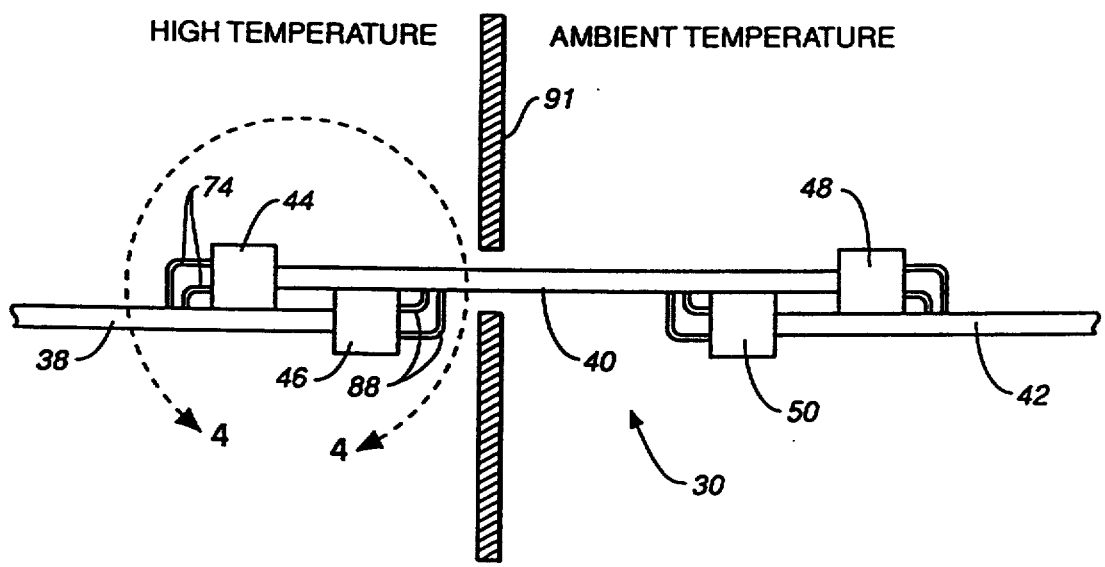
FIG._2

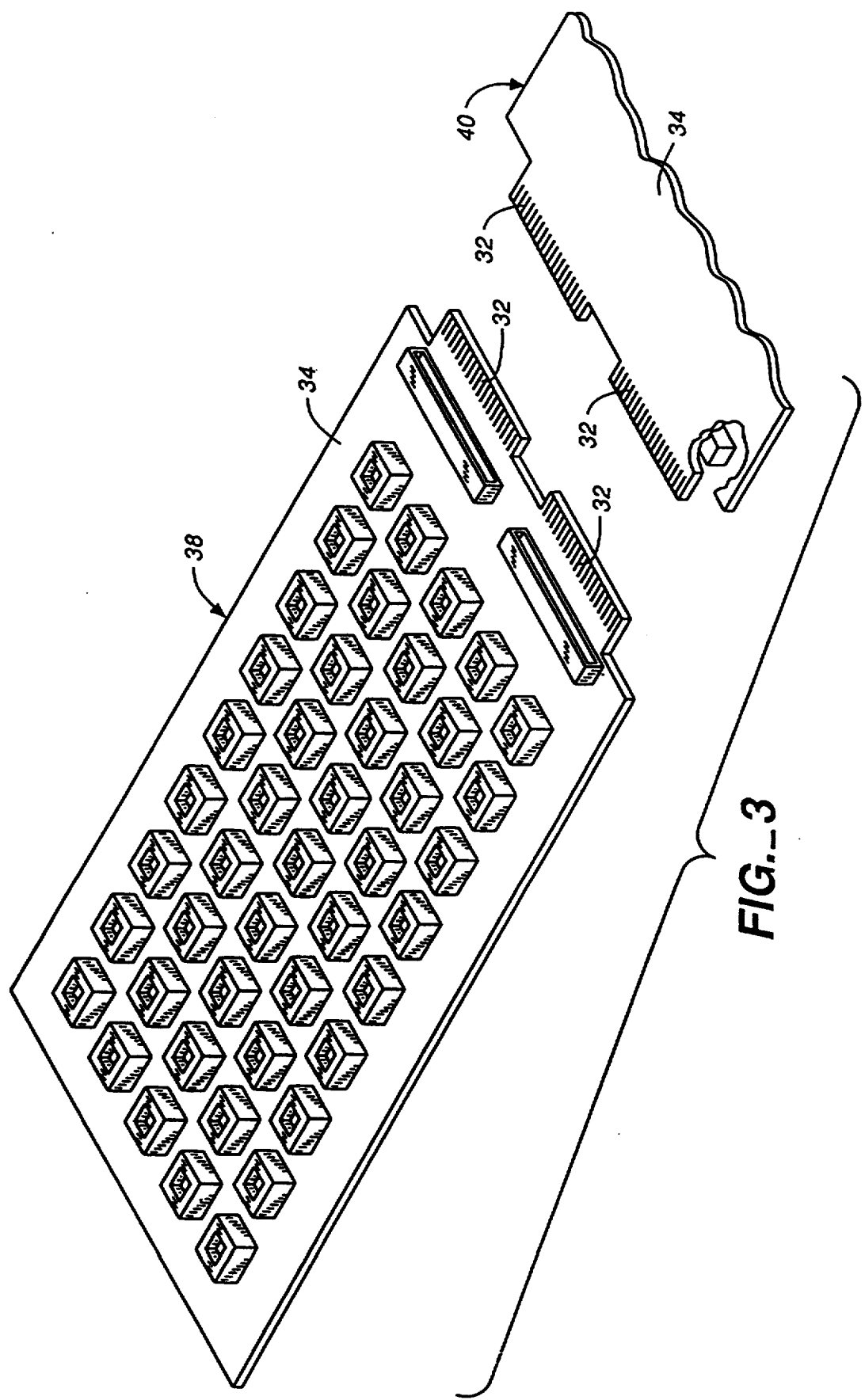
FIG._3

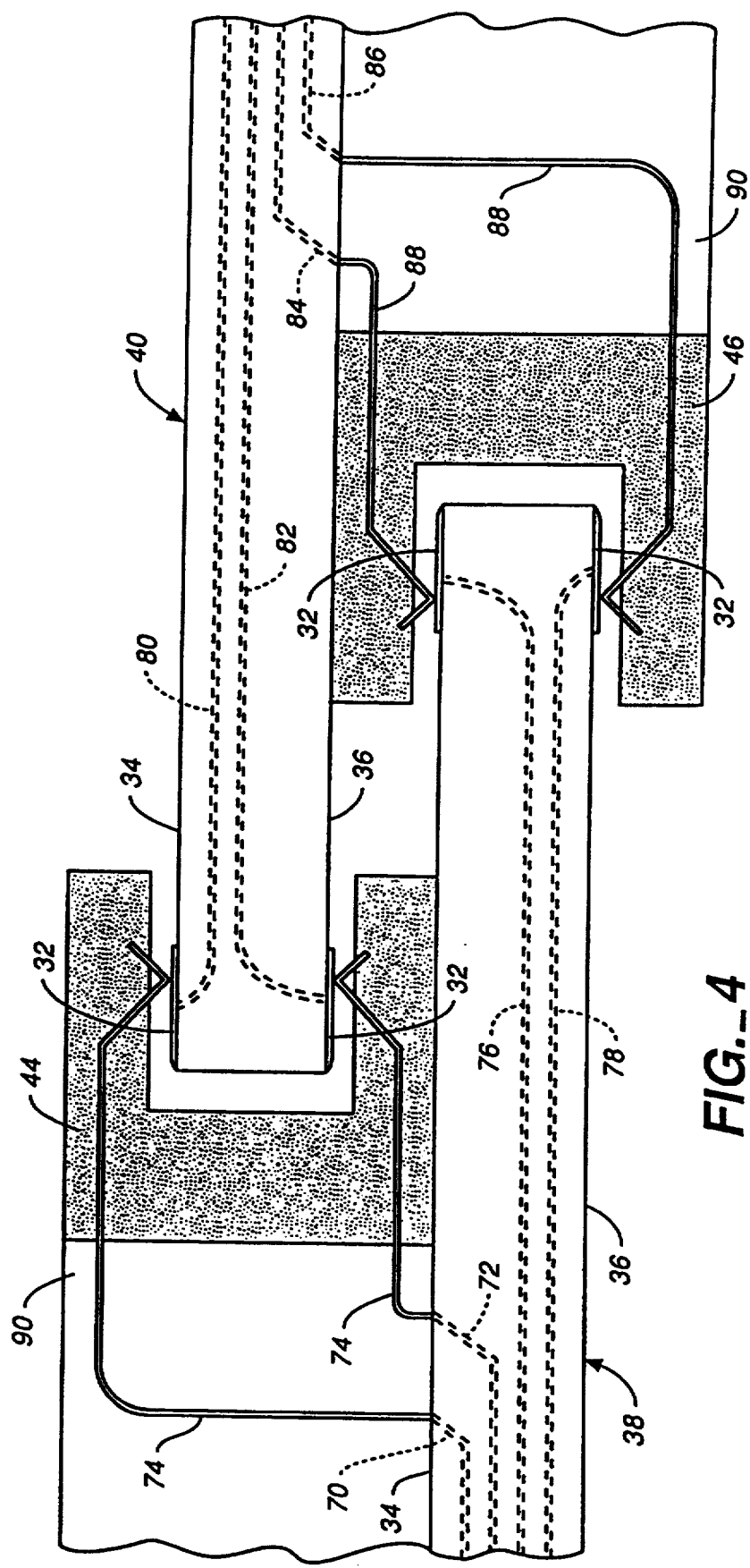
FIG._4

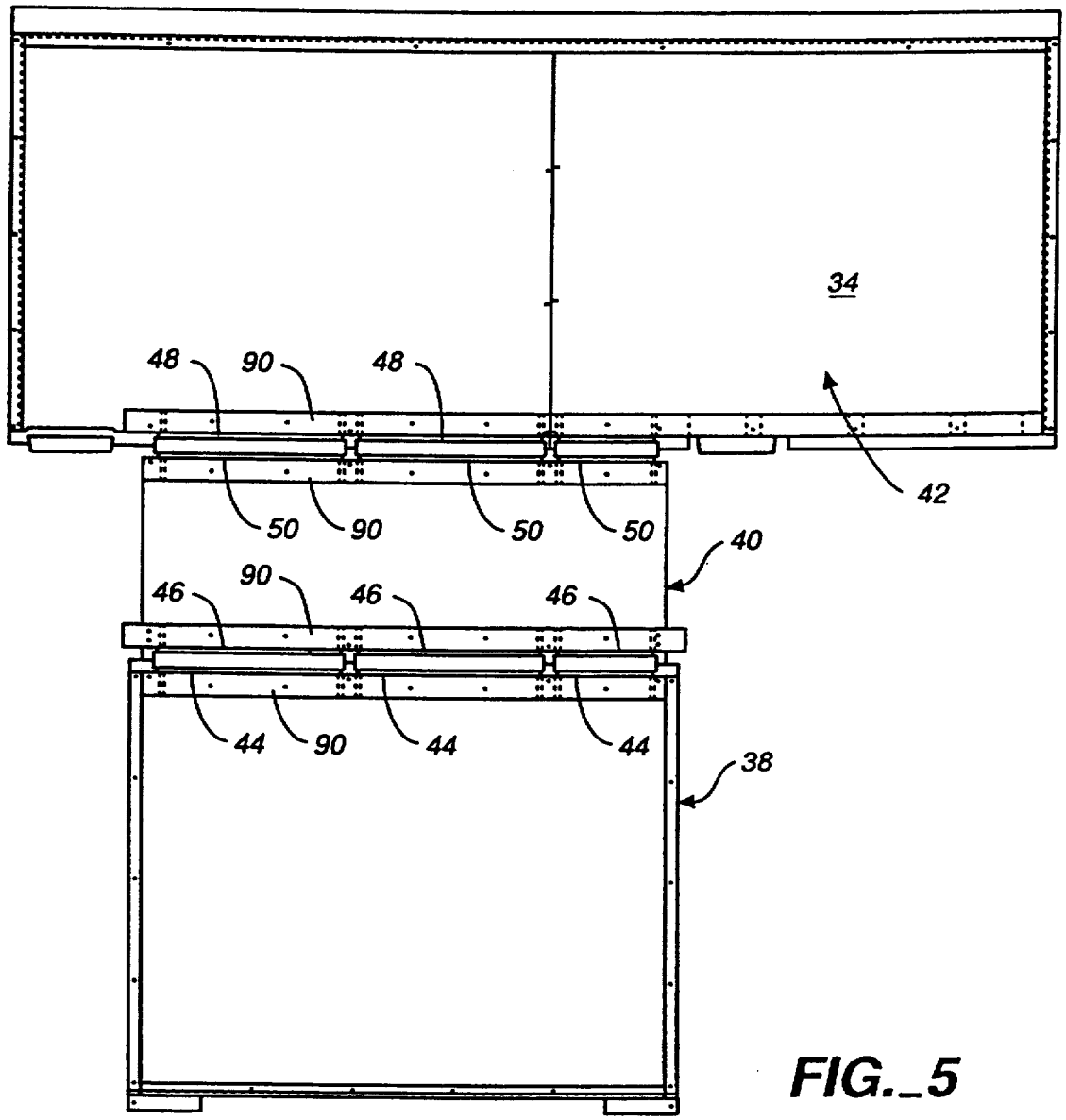
FIG._5

HIGH-DENSITY INTERCONNECT TECHNIQUE

BACKGROUND OF THE INVENTION

1. Field of the Invention

The present invention relates generally to a technique for increasing interconnect density between printed circuit boards (PCBs). More particularly, it relates to such a technique in which at least one of the printed circuit boards is in a high temperature environment. Most especially, it relates to such a technique in which one of the printed circuits is a burn-in board for integrated circuits.

2. Description of the Prior Art

When fabrication of integrated circuits and other semiconductor devices, such as discrete power transistors, has been completed, the semiconductor devices are subjected to burn-in and electrical test in order to identify and eliminate defective semiconductor devices before shipment to a customer. The term "burn-in" relates to a procedure in which the semiconductor devices are heated to an elevated temperature, typically in an oven, and certain operating electrical signals are supplied to the semiconductor devices while they are at the elevated temperature. The use of the elevated temperature accelerates stress to which the devices are subjected during burn-in, so that marginal devices that would otherwise fail shortly after being placed in service fail during burn-in and are eliminated before shipping.

For burn-in, devices are temporarily inserted in sockets of special burn-in boards which include circuit traces for contacting a sufficient number of contact pins or pads on the devices to provide the operating electrical signals used during burn-in. Because the burn-in boards hold a large number of the packaged devices in a closely spaced array, they only permit contact to be made to a limited number of pins or pads of an integrated circuit.

The burn-in board operates in a high-temperature environment. It receives its stimulus signals from a driver board which resides in an ambient environment. The driver and burn-in boards are connected to one another through one or more connectors.

There are many types of connectors, such as card-edge and box connectors, available to connect PCBs, but providing such interconnection at temperatures above 125° C. imposes special restrictions on the materials used and on the design of the connector. At this time, due to material and geometry restrictions, the only type of connector that is rated for use above 125° C. is the card-edge connector, an example 10 of which is shown in prior art FIG. 1. With this type of connector 10, contact fingers are etched on the edge of one PCB 12. Usually, but not always, there are fingers on both surfaces of the PCB 12. These fingers are then inserted into the card-edge connector 10, which is attached to the other PCB 14. Metal contacts 16 in the connector 10 are soldered into the second PCB 14 and contact the fingers on the first PCB 12.

Various densities (finger spacing) of the card-edge connectors are available. As an example, assume that there are fingers on both surfaces 18 and 20 of the PCB 12 and that fingers are spaced at 0.1 inch intervals along the edge of the PCB. In this example, there are 20 interconnects per inch of card edge between the two PCBs 12 and 14.

With increasing integrated circuit complexity, there is a continuing desire to increase the number of connections that can be made to a printed circuit board, for example, during burn-in and also in use of the integrated circuits. A need therefore exists for improved techniques to connect PCBs together, especially in the demanding environment of burn-in.

SUMMARY OF THE INVENTION

A high-density interconnect assembly in accordance with this invention has first and second printed circuit boards. First and second printed circuit board connectors are respectively mounted on the first and second printed circuit boards. Each of the first and second printed circuit boards have a plurality of contact fingers. The first printed circuit board has a first plurality of interconnection lines connected to the first printed circuit board connector and a second plurality of interconnection lines connected to the plurality of contact fingers of the first printed circuit board. The second printed circuit board has a third plurality of interconnection lines connected to the second printed circuit board connector and a fourth plurality of interconnection lines connected to the plurality of contact fingers of the second printed circuit board. The first printed circuit board connector engages the plurality of contact fingers of the second printed circuit board and the second printed circuit board connector engages the of plurality of contact fingers of the first printed circuit board.

The present invention provides an improvement which includes a printed circuit board connector mounted on a printed circuit board. A plurality of contact fingers are spaced from but proximate to the printed circuit board connector. The printed circuit board has a first plurality of interconnection lines connected to the printed circuit board connector and a second plurality of interconnection lines connected to the plurality of contact fingers. The printed circuit board connector is positioned on the printed circuit board to receive a like plurality of contact fingers of another printed circuit board. The plurality of contact fingers of the printed circuit board is positioned on the printed circuit board to engage an additional printed circuit board connector mounted on the another printed circuit board.

A method for interconnecting first and second printed circuit boards includes providing first and second printed circuit board connectors respectively mounted on the first and second printed circuit boards. A plurality of contact fingers is provided on each of the first and second printed circuit boards. The first printed circuit board connector is engaged with the plurality of contact fingers on the second printed circuit board. The second printed circuit board connector is engaged with the plurality of contact fingers on the first printed circuit board.

The interconnect technique of this invention doubles the interconnect density of printed circuit boards. Interconnection of the circuit boards is also self-aligning, due to the geometry of the connectors, contact fingers and circuit boards employed. When at least one of the connectors is high-temperature rated, the interconnect technique is particularly adapted for use with burn-in boards.

The attainment of the foregoing and related advantages and features of the invention should be more readily apparent to those skilled in the art, after review of the following more detailed description of the invention, taken together with the drawings, in which:

BRIEF DESCRIPTION OF THE DRAWINGS

FIG. 1 is an enlarged side view in partial cross-section of a representative prior art interconnect technique used during burn-in of integrated circuits.

FIG. 2 is a side view in partial cross-section of a high density interconnect technique of the invention in use during burn-in of integrated circuits.

FIG. 3 is a partially disassembled perspective view of a portion of the high density interconnect technique shown in FIG. 2.

FIG. 4 is an enlarged view of the portion 4 shown in FIG. 2, to show further detail.

FIG. 5 is a plan view showing layout of a burn-in system incorporating the high density interconnect technique of the invention.

DETAILED DESCRIPTION OF THE INVENTION

Turning now to the drawings, more particularly to FIGS. 2–5, there is shown a high density interconnection system 30 in accordance with the invention. The system 30 employs contact fingers 32 on both surfaces 34 and 36 of burn-in PCB 38, feed-through PCB 40 and driver PCB 42. Each of the PCBs 38, 40 and 42 has a card-edge connector 44, 46 and 48. The feed-through PCB 40 has a second card-edge connector 50 and a second set of contact fingers 32, since it mates with both the burn-in PCB 38 and the driver PCB 42. The contact fingers 32 and the card-edge connectors 44, 46, 48 and 50 of each PCB 38, 40 and 42 mate inversely with each other on adjacent PCBs, i.e., the card-edge connector 44 of the burn-in PCB 38 mates with the contact fingers 32 of the feed-through PCB 40, and the card-edge connector 46 of the feed-through PCB 40 mates with the contact fingers 32 of the burn-in PCB 38, for example. The same relationship exists between the card-edge connector 50 of the feed-through PCB 40, the card-edge connector 48 of the driver PCB 42 and the contact fingers 32 of the feed-through PCB 40 and the driver PCB 42.

A comparison of prior art FIG. 1 and corresponding FIG. 4 for the invention shows that the present invention doubles the number of interconnections achievable with the same finger spacings in the card-edge connectors 10 and the card-edge connectors 44 and 46. As shown in FIG. 1, the PCB 12 has two sets 60 and 62 of interconnection lines that connect to contact fingers 64 for engagement by the card-edge connector 10. Similarly, the PCB 14 has two sets 66 and 68 of interconnection lines that are connected to metal contacts 16 of the card-edge connector 10. In contrast, as shown in FIG. 4, the burn-in PCB 38 has two sets 70 and 72 of interconnections connected to metal contacts 74 of the card-edge connector 44 and two sets 76 and 78 of interconnections connected to contact fingers 32 of the burn-in PCB 38. Similarly, feed-through PCB 40 has two sets 80 and 82 of interconnections connected to contact fingers 32 of the PCB 40 and two sets 84 and 86 of interconnections connected to metal contacts 88 of the card-edge connector 46. Using the same connector as in the prior art example of FIG. 1, the embodiment of FIGS. 2-5 provides 40 interconnects per inch of card edge between two printed circuit boards, compared with 20 interconnects per inch of card edge in the prior art example.

Besides doubling the number of interconnects, the interconnection system 30 is self-aligning. The card-edge connectors 44, 46, 48 and 50 are each set back from the contact fingers 32 of their respective PCBs 38, 40 and 42. Using PCBs 38, 40 and 42 of the same thickness and using connectors 44, 46, 48 and 50 with identical geometry that are mounted directly on the PCBs for both PCBs that are connected together, all dimensional relationships are maintained when the assembly is inverted for the second connection.

As is shown in FIGS. 4 and 5, connector support bars 90 are provided, fixedly attached (such as bolted) on each PCB 38, 40 and 42 behind the connectors 44, 46, 48 and 50 to provide sufficient structural rigidity and support for plugging and unplugging the connectors 44, 46, 48 and 50. Also shown in FIGS. 2 and 5 is the positioning of the burn-in PCB 38 in a high temperature environment of a burn-in system, the feed-through PCB 40 passing through insulated wall 90 of the burn-in system, and the driver PCB 42 outside the burn-in system.

In practice, the card-edge connectors 44, 46, 48 and 50 are implemented with high-temp dual 70 connectors for the longer connectors shown in FIG. 5 and high-temp dual 30 connectors for the shorter connectors shown in FIG. 5. Such high-temperature rated connectors are not required in principle for the connection between the driver PCB 42 and the feed-through PCB 40, but are employed for this connection as well in order to have consistency of geometry with the connection between the feed-through PCB 40 and the burn-in PCB 38. These connectors are commercially available from Micro Plastics, Inc., Chatsworth, Calif., under the designations MPS-1100-70-DW-5KRY and MPS-1100-30-DW-5KRY.

Other than as specifically described above, the PCBs 38, 40 and 42 are implemented with conventional epoxy or polyimide burn-in or printed circuit boards. The interconnection system 30 is used with an otherwise conventional burn-in system, such as those which are commercially available from the assignee of the present invention.

It should further be apparent to those skilled in the art that various changes in form and details of the invention as shown and described may be made. For example, the card-edge connectors shown could be replaced with custom box-type connectors that have been modified to make them suitable for high temperature environments. Such connectors would allow a higher interconnection density than is achieved with the card-edge connectors. Appropriate modifications to the PCBs would be required to use box-type connectors. The feed-through board could be eliminated by elongating the driver board to allow a portion of it to pass through the insulated wall of the burn-in system. It is intended that such changes be included within the spirit and scope of the claims appended hereto.

What is claimed is:

1. An interconnection assembly, which comprises first and second printed circuit boards, first and second printed circuit board connectors respectively mounted on said first and second printed circuit boards, each of said first and second printed circuit boards having a plurality of contact fingers, said first printed circuit board having a first plurality of interconnection lines connected to said first printed circuit board connector and a second plurality of interconnection lines connected to said plurality of contact fingers of said first printed circuit board, said second printed circuit board having a third plurality of interconnection lines connected to said second printed circuit board connector and a fourth plurality of interconnection lines connected to said plurality of contact fingers of said second printed circuit board, said first printed circuit board connector engaging said plurality of contact fingers of said second printed circuit board and said second printed circuit board connector engaging said plurality of contact fingers of said first printed circuit board.

2. The interconnection assembly of claim 1 in which said first and second printed circuit board connectors are card-edge connectors, said first and second printed circuit board connectors being mounted on said first and second printed circuit boards set back from an edge of said first and second printed circuit boards, and said plurality of contact fingers being located proximate to said edge of said first and second printed circuit boards.

3. The interconnection assembly of claim 2 in which said first printed circuit board is a burn-in board, least said first printed circuit board connector is a high temperature rated connector, and said second printed circuit board is a board configured to extend through an insulated wall of a burn-in system.

4. The interconnection assembly of claim 3 additionally comprising a third, driver printed circuit board, a third printed circuit board connector mounted on said third, driver printed circuit board set back from an edge of said third, driver printed circuit board, said third printed circuit board connector having a plurality of contact fingers located proximate to said edge of said third, driver printed circuit board, said second circuit board having a fourth printed circuit board connector set back from another edge of said second printed circuit board, said second printed circuit board having an additional plurality of contact fingers proximate said another edge, said first printed circuit board connector engaging said plurality of contact fingers of said second printed circuit board and said second printed circuit board connector engaging said plurality of contact fingers of said first printed circuit board.

5. The interconnection assembly of claim 1 additionally comprising first and second connector support bars respectively attached to said first and second printed circuit boards behind said first and second printed circuit board connectors.

6. In a printed circuit board, the improvement which comprises a printed circuit board connector mounted on said printed circuit board, a plurality of contact fingers spaced from but proximate to said printed circuit board connector, said printed circuit board having a first plurality of interconnection lines connected to said printed circuit board connector and a second plurality of interconnection lines connected to said plurality of contact fingers, said printed circuit board connector being positioned on said printed circuit board to receive a like plurality of contact fingers of another printed circuit board, said plurality of contact fingers of said printed circuit board being positioned on said printed circuit board to engage an additional printed circuit board connector mounted on the another printed circuit board.

7. The printed circuit board of claim 6 in which said printed circuit board is a burn-in board, a feed-through board or a driver board.

8. The printed circuit board of claim 6 additionally comprising a connector support bar attached to said printed circuit board behind said printed circuit board connector.

9. The printed circuit board of claim 8 in which said printed circuit board connector is a card-edge connector, said printed circuit board connector being mounted on said printed circuit board set back from an edge of said printed circuit board, and said plurality of contact fingers being located proximate to said edge of said printed circuit board.

10. A method for interconnecting first and second printed circuit boards, which comprises providing first and second printed circuit board connectors respectively mounted on the first and second printed circuit boards, providing a plurality of contact fingers on each of the first and second printed circuit boards, engaging the first printed circuit board connector with the plurality of contact fingers on the second printed circuit board, and engaging the second printed circuit board connector with the plurality of contact fingers on the first printed circuit board.

11. The method of claim 10 in which the first and second printed circuit board connectors are card-edge connectors, the first and second printed circuit board connectors are mounted on the first and second printed circuit boards spaced from an edge of the first and second printed circuit boards, and the plurality of contact fingers are located proximate to the edge of the first and second printed circuit boards.

12. The method of claim 10 in which the first printed circuit board is a burn-in board, the second printed circuit board is a feed-through board, at least the first printed circuit board connector is a high temperature rated connector, and the method comprises the additional step of positioning the first printed circuit board in a burn-in system, with the second printed circuit board extending through an insulated wall of the burn-in system.

* * * * *